United States Patent

[11] 3,571,650

[72] Inventors Richard J. Hofmeister
Arlington Heights;
Thomas R. Steele, Lombard, Ill.

[21] Appl. No. 781,064
[22] Filed Dec. 4, 1968
[45] Patented Mar. 23, 1971
[73] Assignee Motorola Inc
Franklin Park, Ill.

[54] SEMICONDUCTOR RECTIFIER PACKAGE
7 Claims, 5 Drawing Figs.

[52] U.S. Cl. .......... 313/317,
321/8, 321/11, 317/234, 174/50
[51] Int. Cl. .......... H01j 5/00
[50] Field of Search .......... 317/234,
235, 1, 2, 3, 11; 174/50, 50.51; 321/8, 11; 315/20;
313/1, 2, 317

[56] References Cited

UNITED STATES PATENTS

| | | | |
|---|---|---|---|
| 2,800,620 | 7/1957 | Ebbeler et al. | 321/8 |
| 3,369,166 | 2/1968 | Lake | 321/8 |
| 3,363,150 | 1/1968 | Whitman et al. | 317/234 |
| 3,373,336 | 3/1968 | Schillmann et al. | 317/234 |

FOREIGN PATENTS

| | | | |
|---|---|---|---|
| 1,126,517 | 3/1962 | Germany | 317/234 |

*Primary Examiner*—James D. Kallam
*Assistant Examiner*—Andrew J. James
*Attorney*—Mueller and Aichele

ABSTRACT: A solid-state high-voltage silicon rectifier assembly is placed in a dielectric package adapted to fit within the tube enclosure conventionally used in television receivers to enclose the high voltage rectifier tube. The generally cylindrical shape of the package surrounding the rectifier elements is flared outwardly at its upper end to form a disc surrounding the upper portion of the package. Above the disc, the package is widened so that it has approximately the same diameter as the diameter of a conventional high-voltage rectifier tube; and the terminal caps at both ends of the rectifier assembly are made the same size as the end cap used on the anode of conventional high voltage rectifier tubes. The diameter of the disc is chosen to be such that the assembly cannot be inserted upside down into the tube enclosure; and a pair of flanges are provided to permit the assembly to be guided by the socket guide channels on the inside of the tube enclosure. These flanges also wedge the rectifier assembly into the tube enclosure so that it cannot easily be shaken loose.

INVENTORS.
RICHARD J. HOFMEISTER
THOMAS R. STEELE

BY Mueller, Aichele & Rauner
ATTORNEYS.

SEMICONDUCTOR RECTIFIER PACKAGE

BACKGROUND OF THE INVENTION

In the development of solid-state large screen color television receivers, it previously has been possible to provide solid-state circuitry for all portions of the color television receiver with the exception of the high voltage rectifier tube. This tube used in color television receivers must be capable of operating under high voltage stress up to 35,000 volts peak inverse voltage, coupled with a pulse type of operation at extremely high frequencies. Solid-state diodes with breakdown voltages between 500 to 1,000 volts have been available for many years, and it has been common practice to stack these diodes in series to handle high voltages. This has been successful for DC voltages and for low frequency high AC voltages. Wide variations, however, in distributed capacitance, voltage breakdown and switching time between individual solid-state rectifier chips resulted in uneven distribution of the television pulse voltages, causing catastrophic overload of some individual diodes in the diode stack and eventually resulted in short life for such assemblies in applications of the type encountered in color television receivers. As a consequence, it has been necessary to utilize conventional high voltage rectifier tubes in solid-state large screen color television receivers, even though such rectifier tubes require an additional filament winding on the flyback transformer and the heater filament of the tube deteriorates under use and eventually fails, requiring replacement.

At the present time, silicon rectifier chips of substantial uniformity have been developed, and stacks of these rectifiers chips to form high voltage rectifiers now have made it possible to provide a high-voltage solid-state rectifier which is capable of replacing the high-voltage rectifier tube previously used. In order best to utilize such a high-voltage rectifier, however, it is desirable to provide a housing for the rectifier stack which is compatible with the tube enclosures and other components of television receivers, so that the high voltage rectifier may be substituted, with only minor modifications, into receiving sets currently utilizing high voltage rectifier tubes.

SUMMARY OF THE INVENTION

It is an object of this invention to provide a solid-state high-voltage rectifier assembly which is compatible with the tube enclosures currently used in television receivers.

It is another object of this invention to provide a high-voltage rectifier assembly which cannot be inserted into the television receiving circuit with the wrong polarity, even though the person inserting the assembly into the receiver has no knowledge of the polarity of the rectifier elements housed within the assembly.

It is a further object of this invention to provide a high-voltage solid-state rectifier assembly which fits into the tube enclosure of a television set in such a manner that it cannot readily be dislodged by vibration of the set.

These and other objects of the invention are accomplished in a preferred embodiment of the invention by housing the high-voltage rectifier stacks in a generally cylindrically shaped package or housing made of a dielectric material and having a widened portion in the form of a disc at the upper end of the package. In addition, a pair of flanges on opposite sides of the cylindrical package fits into the channels of the tube enclosure used to guide the sockets into place and wedge the rectifier assembly into the tube enclosure. Terminal caps are located at both ends of the rectifier assembly and at least one is of the same size as the cap used on the plate of the high voltage rectifier tube so that the circuit interconnections to the high voltage rectifier assembly are compatible with the circuit interconnection used in tube assemblies.

DETAILED DESCRIPTION

Figure 1:
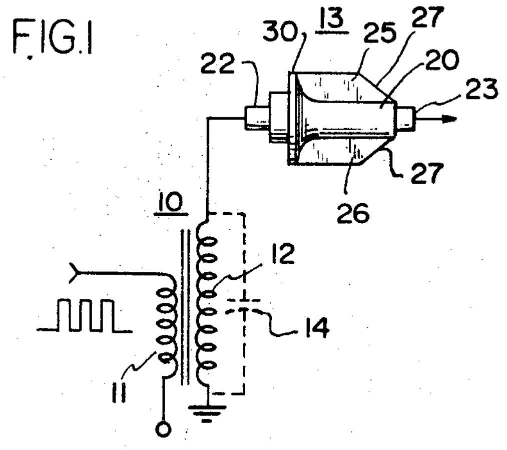
FIG. 1 is a partial schematic wiring diagram showing the manner in which the high voltage rectifier assembly is connected to the flyback transformer of a television receiver.

Referring now to FIG. 1, there is shown a portion of the high-voltage circuit of a color television receiver having a horizontal flyback transformer 10 to which deflection pulses are applied to one end of a primary winding 11 in a conventional manner, with the other end of the primary winding 11 being connected to a suitable source of positive potential. The secondary winding of the transformer 10 is connected between AC ground and one terminal of a high-voltage solid-state rectifier 13, the other terminal of which is connected to the second anode of the cathode ray tube (not shown). It will be noted that there is no additional filament winding on the transformer 10, as contrasted with a circuit using a high-voltage rectifier tube of the type commonly employed in television receivers. Since the capacitance of the high-voltage solid-state rectifier 13 is not as high as the capacitance in the circuit of a high-voltage rectifier tube, added distributed capacitance 14 must be provided across the secondary winding 12 of the transformer 10. It is apparent, however, that the transformer 10 used in conjunction with the solid-state rectifier 13 is a much simpler transformer than the transformer commonly employed in the high-voltage circuit of a television receiver since the filament winding has been eliminated.

Figure 3:
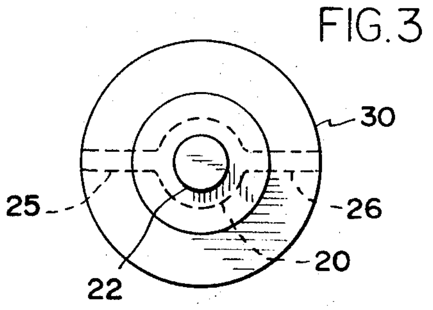
FIG. 3 is a top view of the rectifier assembly.
Figure 4:
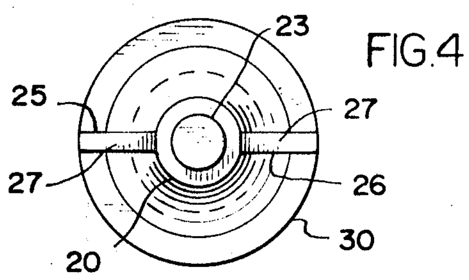
FIG. 4 is a bottom view of the rectifier assembly.
Figure 2:
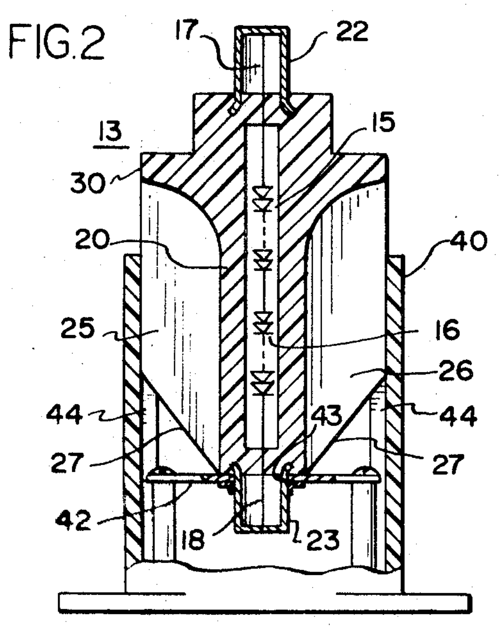
FIG. 2 is a partially cut away side view of the rectifier assembly package and the enclosure in which it is mounted.

Referring now to FIGS. 2, 3 and 4, there are shown details of the high-voltage rectifier assembly 13 used in the circuit of FIG. 1. The rectifier portion of the assembly is comprised of one or more strings of silicon rectifier chips of uniform electrical characteristics, and in FIG. 2 two such strings 15 and 16 have been shown connected in series. The number of silicon chips or diodes in each of the strings, and the number of total diodes in the assembly, is determined by the voltage requirements of the circuit in which the rectifier is to be used and can be varied from application to application. The strings of rectifiers 15 and 16 terminate at each end in conductor or terminal leads 17 and 18, which pass through the ends of a generally cylindrically-shaped housing or package 20 which encapsulates the rectifier strings 15 and 16. The housing 20 may be made of any suitable epoxy encapsulant provided with a suitable filler for providing electrical and humidity insulation for the rectifier strings. The particular material used in the housing 20 is not critical, so long as it provides the proper dielectric characteristics coupled with good mechanical rigidity and humidity resistance.

The terminals 17 and 18 of the rectifier strings are electrically connected in any suitable manner to a pair of end caps 22 and 23, respectively, the open ends of which are encapsulated in the package 20; so that the caps 22 and 23 are mechanically, rigidly held in place.

Figure 5:
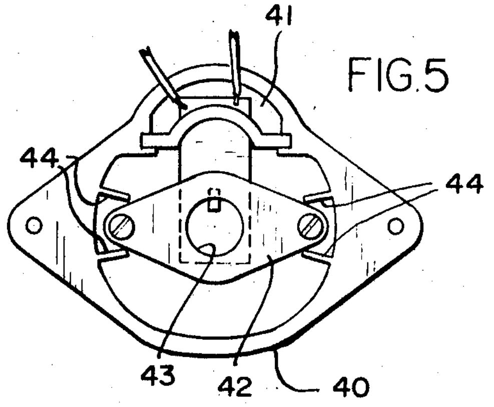
FIG. 5 is a top view of the tube enclosure in which the high-voltage solid-state rectifier assembly is to be mounted.

In order that the rectifier assembly may be compatible with and fit within the tube enclosures commonly used to house high-voltage rectifier tubes in color television sets, a pair of longitudinal flanges 25 and 26 are formed on opposite sides of the package 20. The lowermost portion of the flanges 25 and 26 is tapered from the outer extremity of the flange toward the diameter of the main portion of the package 20 to provide camming surfaces 27 to facilitate insertion of the assembly into the tube enclosure. The upper end of the package 20 is flared out to provide an annular ring or disc 30 at right angles to the upper portion of the package and providing a support for the upper end of the flanges 25 and 26. The portion of the assembly above the disc 30 is wider than the portion below the disc and has a diameter chosen to be approximately equal to the diameter of a high-voltage rectifier tube of the type normally employed in the installations where this assembly will be used. In FIGS. 2 and 5 there is shown a tube enclosure of the type into which the high-voltage rectifier assembly is to be inserted. The body 40 of the tube enclosure has a generally cylindrical cross section, with a wire guide channel 41 extending along the length of the enclosure from the bottom thereof to the top for guiding leads extending from a socket 42 located near the bottom of the enclosure 40 to the top of the enclosure since, in the conventional mounting of the tube enclosure, it is not possible to provide an opening in the bottom of the enclosure for passing the wire from the socket to the outside of the enclosure 40. The socket 42 for use with the rectifier assembly 13 need only be provided with a single contact and is shown having a hold 43 located in its center to mate with the end cap 23 at the lower end of the rectifier assembly 13. The conventional tube enclosure 40 includes a pair of ribs 44 on each side thereof, and each pair of ribs 44 defines a longitudinal channel used in guiding the socket 42 into proper position at the bottom of the enclosure 40 where the socket 42 is secured by means of suitable fasteners.

The rectifier assembly 13 is inserted into the enclosure 40 by placing the flanges 25 and 26 in the channels between the ribs 44. The width across the flanges 25 and 26 is slightly greater than the inside diameter of the enclosure 40, so that when the rectifier assembly 13 is pushed into the enclosure 40, it causes the enclosure 40 to be distorted into a slightly oval cross sectional configuration. Thus, the enclosure 40 provides a firm frictional engagement with the extremities of the flanges 25 and 26, so that the rectifier assembly 13 is held tightly in place in the enclosure 40. The channels between the ribs 44 also serve to guide the rectifier assembly into proper alignment with the socket 42, so that the end cap 23 engages the hole 43 in the socket 42. The cap 17 of the rectifier 13 then is connected to the secondary winding of the flyback transformer in the same manner that is used to connect a rectifier tube since the end cap 22 is made the same size as the anode caps normally used on high-voltage rectifier tubes.

Since the diameter of the disc 30 is the same as the width across the flanges 25 and 26, the assembly 13 cannot be inserted into the enclosure 40 upside down due to the fact that the disc 30 will not fit inside the enclosure 40.

Use of the high-voltage solid-state rectifier 13 in place of a conventional high-voltage tube rectifier provides a number of advantages in a solid-state television receiver. It is now possible to provide instant warmup of the rectifier, fully complimenting the instant warmup characteristics of the other semiconductor devices in a solid-state television chassis to provide instant sound and picture for the receiver in which the assembly 13 is used. As stated previously, there is no longer a problem of heater filament burn-out, which is associated with high voltage rectifier tubes. In addition the efficiency of a solid-state high-voltage rectifier is greater than that of a high-voltage tube, with the result that more high-voltage power is available to the picture tube for providing a bright picture. It also should be noted that in addition to providing protection against wrong insertion of the rectifier, the disc 30 provides added protection against arc-over between the end caps 22 and 23 of the rectifier 13, since the disc 30 lengthens the path, in air, between the end caps.

We claim:

1. A solid state rectifier assembly for use in the high-voltage circuit of a television receiver, said receiver having an enclosure for mounting a high voltage rectifier, said enclosure including a hollow cylinder having a pair of longitudinal guide channels located on opposite sides of the inside walls thereof for guiding the placement of a socket to a position at the bottom of the enclosure, said rectifier assembly including in combination:
- a high-voltage semiconductor rectifier device in a generally linear configuration having terminal leads at each end;
- an elongated dielectric package encasing the semiconductor device with the terminal leads extending through the ends of the package;
- a pair of longitudinal flanges attached to opposite sides of the elongated package, the distance between the outer extremities of the flanges being slightly larger than the distance across said enclosure between said guide channels;
- a dielectric disc near one end of and attached to the body of the dielectric package and attached to the flanges substantially at right angles thereto, said disc having an outside diameter sufficient to prevent insertion of the rectifier assembly into said enclosure past the disc; and
- a pair of end caps located on each end of the rectifier assembly and having the terminal leads connected thereto.

2. A rectifier assembly according to claim 1 wherein at least one of said end caps is of the same size as the plate cap commonly used with the high-voltage rectifier tube in a television set.

3. A rectifier assembly according to claim 1 wherein both of the end caps are of the same size.

4. A rectifier assembly according to claim 1 wherein the portion of the rectifier package between the disc and the end cap nearest the disc is of a circular cross-sectional configuration having a diameter greater than the diameter of the elongated package between the disc and the other end cap.

5. A rectifier assembly according to claim 1 wherein the dielectric package, the pair of flanges and the disc are an integral assembly.

6. A rectifier assembly according to claim 1 wherein the flanges have a generally wedge-shaped configuration extending from the disc to a point contiguous with the outside diameter of the dielectric package near the end remote from the disc, so that insertion of the rectifier assembly into said enclosure with the flanges aligned with the channels in said enclosure causes the flanges to be guided by the channels and to distort said enclosure from a generally circular cross-sectional configuration to an oval cross-sectional configuration, thereby causing said enclosure to firmly grip the rectifier assembly when it is inserted therein.

7. A rectifier assembly according to claim 6 wherein the wedge-shaped flange members have a camming surface located at the end of the rectifier assembly remote from the disc and wherein the remainder of the flange surfaces at the outer edge thereof are generally parallel to the longitudinal axis of the elongated package.